United States Patent
Ito et al.

(10) Patent No.: US 10,238,019 B2
(45) Date of Patent: Mar. 19, 2019

(54) WIRE HARNESS

(71) Applicant: YAZAKI CORPORATION, Tokyo (JP)

(72) Inventors: Yuto Ito, Tochigi (JP); Yoshio Shionome, Tochigi (JP); Takashi Oguri, Tochigi (JP); Jin Omori, Tochigi (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 16/039,401

(22) Filed: Jul. 19, 2018

(65) Prior Publication Data
US 2019/0045678 A1 Feb. 7, 2019

(30) Foreign Application Priority Data
Aug. 7, 2017 (JP) .................................. 2017-152592

(51) Int. Cl.
| | | |
|---|---|---|
| H05K 9/00 | (2006.01) | |
| H02G 3/04 | (2006.01) | |
| H02G 3/32 | (2006.01) | |
| H02G 3/03 | (2006.01) | |
| B60R 16/02 | (2006.01) | |
| H01B 7/00 | (2006.01) | |

(52) U.S. Cl.
CPC ....... *H05K 9/0098* (2013.01); *B60R 16/0215* (2013.01); *H01B 7/0045* (2013.01); *H02G 3/03* (2013.01); *H02G 3/0468* (2013.01); *H02G 3/32* (2013.01)

(58) Field of Classification Search
CPC ............ B60R 16/0215; B60R 16/0207; H01B 7/0045; H02G 3/03; H02G 3/04; H02G 3/0462; H02G 3/0475; H02G 3/0468
See application file for complete search history.

(56) References Cited

U.S. PATENT DOCUMENTS

| | | | |
|---|---|---|---|
| 2004/0099427 A1 | 5/2004 | Kihira | |
| 2013/0068522 A1* | 3/2013 | Ogawa | ................ B60R 16/0215 174/72 A |
| 2015/0179300 A1* | 6/2015 | Inao | .................... B60R 16/0215 174/68.3 |
| 2016/0152196 A1* | 6/2016 | Inao | .................... B60R 16/0215 174/72 A |

FOREIGN PATENT DOCUMENTS

JP 2004-171952 A 6/2004

* cited by examiner

*Primary Examiner* — Timothy J Thompson
*Assistant Examiner* — Amol H Patel
(74) *Attorney, Agent, or Firm* — Kenealy Vaidya LLP

(57) ABSTRACT

A wire harness includes a plurality of electric wires, a plurality of tubular metal pipes corresponding the number to the plurality of electric wires, each of the plurality of electric wires being inserted through respective one of the plurality of tubular metal pipes, a connector configured to be connected to end portions of the plurality of electric wires, and a tubular metal connecting portion provided at a pipe end portion of each of the plurality of pipes and connected to the connector. Each of the pipes has a rigidity capable of self-holding a bent shape thereof when each of the pipes are bent. The connecting portion has a flexibility incapable of self-holding a bent shape thereof when the connecting portion is bent.

8 Claims, 13 Drawing Sheets

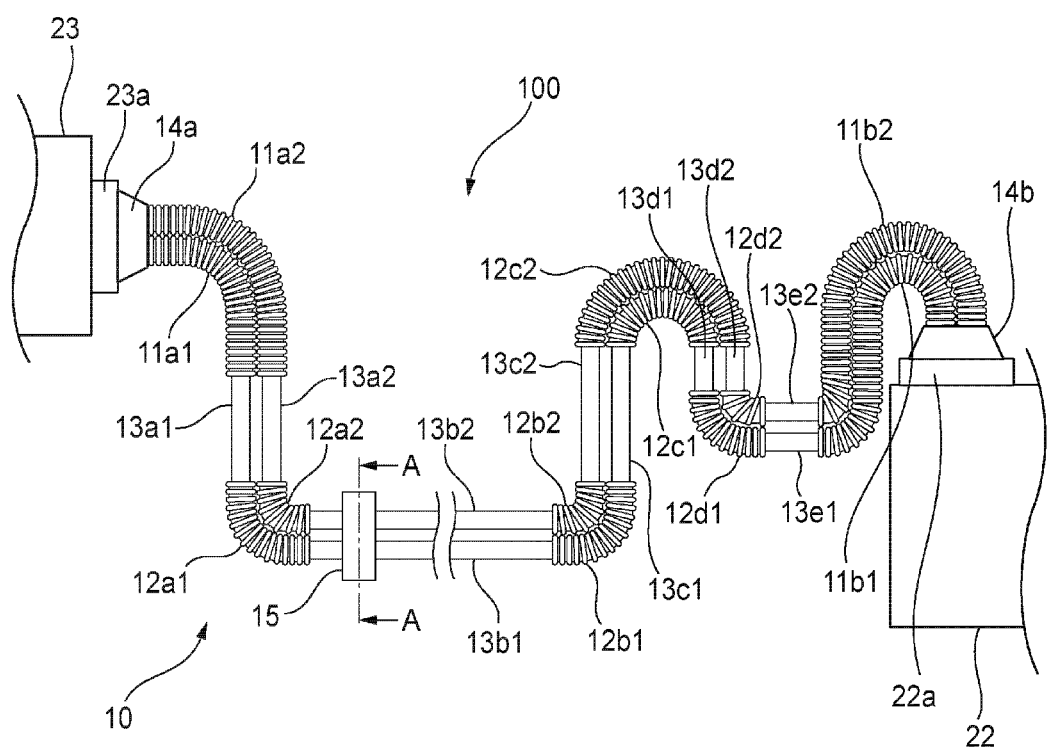

WIRE HARNESS

CROSS REFERENCE TO RELATED APPLICATIONS

This application is based on Japanese Patent Application (No. 2017-152592) filed on Aug. 7, 2017, the contents of which are incorporated herein by reference.

BACKGROUND OF THE INVENTION

1. Field of the Invention

The present invention relates to a wire harness using an electric wire imparted with a shielding function.

2. Description of the Related Art

Recently, there is proposed a wire harness using an electric wire to which a shielding function is imparted (a so-called shielded electric wire) by a shielding member having a function of blocking electromagnetic noise or the like, so as to connect various devices (a battery, an inverter, an motor, etc.) configuring an electric drive system of a hybrid automobile, an electric automobile, or the like.

For example, one conventional wire harness includes a metal pipe made of aluminum or the like as a shielding member, and a plurality of electric wires are inserted through a hollow portion of the metal pipe all together. The conventional wire harness is designed to improve the workability of a shielding process by inserting the plurality of electric wires all together through the hollow portion of the shielding member (the metal pipe), as compared with a case where the shielding process is individually performed on each of the plurality of electric wires (see, for example, JP-A-2004-171952).

However, in the related wire harness, since the plurality of electric wires are inserted through the hollow portion of the metal pipe all together, the plurality of electric wires are disposed close to each other so as to come into contact with each other in the hollow portion of the metal pipe. Due to such a configuration, it is difficult for Joule heat generated in each of the electric wires due to an electric current flowing through each of the plurality of electric wires to dissipate heat, and particularly at places where the electric wires contact with each other, heat is accumulated (so-called heat interference occurs) in some cases. Further, since the plurality of electric wires is sealed in the hollow portion of the metal pipe, it is more difficult for the Joule heat to dissipate heat, and a degree of heat interference may be further increased in some cases.

The electric wires are generally designed to sufficiently withstand the Joule heat generated by themselves. However, if excessive heat interference occurs due to the above-mentioned reasons, there is a possibility that heat degradation may occur to the electric wires (in particular, for a resin material forming an insulating layer). It is desired to suppress such heat degradation as much as possible from a viewpoint of improving the quality of the wire harness or the like.

SUMMARY OF THE INVENTION

The present invention is made in view of the above circumstances and an object thereof is to provide a wire harness capable of imparting a shielding function to a plurality of electric wires and suppressing heat interference between the electric wires.

In order to achieve the above objects, the wire harness according to the present invention is characterized by the following (1) to (4).

(1) There is provided a wire harness including:
a plurality of electric wires;
a plurality of tubular metal pipes corresponding the number to the plurality of electric wires, each of the plurality of electric wires being inserted through respective one of the plurality of tubular metal pipes;
a connector configured to be connected to end portions of the plurality of electric wires; and
a tubular metal connecting portion provided at a pipe end portion of each of the plurality of pipes and connected to the connector,
wherein each of the pipes has a rigidity capable of self-holding a bent shape thereof when each of the pipes are bent, and
wherein the connecting portion has a flexibility incapable of self-holding a bent shape thereof when the connecting portion is bent.

(2) In the wire harness according to (1), the connecting portion is a bellows-shaped first part or a braided conductor which is made of metal and configured to be bendable by an external force smaller than one capable of bending the pipe.

(3) In the wire harness according to (1) or (2), an intermediate portion of the pipe includes a tubular metal second part formed into a bellows shape which is configured to be bendable by an external force smaller than one capable of bending the pipe and self-hold a bent shape of the pipe when the pipe is bent.

(4) The wire harness according to any one of the (1) to (3) further includes a conductive binding member configured to bind the plurality of pipes and fix the plurality of pipes to an attachment object.

According to the wire harness (1) with the above configuration, the plurality of metal pipes is provided to correspond the number to the plurality of electric wires. That is, each of the electric wires is inserted through respective one of the plurality of pipes. The wire harness is configured by the plurality of pipes through which the electric wires are inserted respectively, a connector, and a connecting portion. Therefore, unlike the related wire harness mentioned above, the plurality of electric wires are not disposed close to each other in the pipe of the present wire harness, so that heat interference between the electric wires can be suppressed compared with the related wire harness.

Further, according to the present wire harness, a shielding function can be appropriately imparted to the electric wires since each of the entire electric wire is covered by the pipe and the connecting portion which are made of metal. Specifically, the electric wires can be protected from external shock caused by bounced stones or the like in a case where the electric wires are routed under a floor of a vehicle while electromagnetic noise emitted from the electric wires is blocked. In addition, the pipe has a rigidity that can self-hold a shape after bending, so that a number of fixing tools (a clamp or the like) can be reduced when the pipe is assembled to a vehicle, for example. The connecting portion (a portion which connects the pipe end portion of the pipe and the connector) has a flexibility that cannot self-hold a shape after bending, so that the connecting portion can be flexibly deformed and the wire harness can be machined along a routing form.

Therefore, in the wire harness with the above configuration, a shielding function can be imparted to the plurality of electric wires and heat interference between the electric wires can be suppressed. Further, due to the flexibility of the connecting portion, dimensional errors (manufacturing variations) inevitable in the pipe can be absorbed, and vibrations or the like that may occur when the wire harness is actually mounted on a vehicle or the like can also be absorbed.

Incidentally, the "rigidity" mentioned above represents a force (load/deformation amount) required to cause unit deformation of an object (a pipe or the like), and a degree of difficulty of deforming the object. Rigidity includes bending rigidity, shear rigidity, torsional rigidity or the like.

According to the wire harness (2) with the above configuration, a bellows-shaped first part or a braided conductor, which is made of metal and can be bent by an external force smaller than one sufficient to bend the pipe, can be used as the connecting portion. In a case where the bellows-shaped first part is used as the connecting portion, if the first part is configured as a seamlessly continuous portion from the pipe for example, a number of components can be reduced since it is unnecessary to use a plurality of components compared with a case where the braided conductor is used. Since there is no joint part between the components, it is not necessary to use a waterproofing member (a grommet or the like) for corrosion prevention. Further, in a case where the bellows-shaped first part is used as the connecting portion, if the first part prepared as separated members is joined to the pipe for example, a process of inserting the electric wires therethrough is easier since a total length of the pipe and the first part are shortened compared with the case where the first part is configured as a continuous portion from the pipe. The pipe and the first part are formed of suitable metal materials separately, so that the manufacturing and use of the wire harness can be made easier. On the other hand, in a case where the braided conductor is used, the connecting portion can be easily prepared and obtained at low cost since it is not necessary to machine a tubular metal material into a bellows shape as in the case where the braided conductor is used. Further, a weight of the wire harness can be reduced since the braided conductor is generally lighter than a tubular metal material.

According to the wire harness (3) with the above configuration, an intermediate portion of the pipe includes a tubular metal second part which is formed into a bellows shape and can be bent by an external force smaller than one sufficient to bend the pipe. Therefore, the work of bending the wire harness along the routing form (layout) of the electric wires can be facilitated. Specifically, when bending a metal pipe, countermeasures such as using a metal core to prevent the pipe from being flattened are performed (to maintain an inner diameter of the pipe) in general, and a dedicated machining equipment is required in some cases. However, according to the above configuration, the second part (the bellows-shaped portion) can be bent by an external force smaller than one sufficient to bend the pipe, so that the wire harness can be machined into a shape along the routing form without using such a dedicated machining equipment (for example, by manual work of an operator) as long as the second part is disposed at a bending position in the routing form of the wire harness.

According to the wire harness (4) with the above configuration, the plurality of pipes configuring the wire harness are bound by a conductive binding member and fixed to an attachment object (for example, a vehicle body frame of a vehicle). Accordingly, the electromagnetic noise blocked by the conductive pipe can be discharged to the attachment object via the binding member after passing through the pipe itself. Therefore, it is not necessary to provide a dedicated mechanism (earth mechanism/shell mechanism) for discharging the electromagnetic noise to the connector or the like. As a result, a number of components of the wire harness can be reduced, and the manufacturing of the wire harness can be facilitated and the cost can be reduced.

According to the present invention, a wire harness capable of imparting a shielding function to a plurality of electric wires and suppressing heat interference between the electric wires is provided.

The present invention has been briefly described above. Further, details of the present invention will be clarified by reading a mode (hereinafter, referred to as "embodiment") for carrying out the invention described below with reference to attached drawings.

BRIEF DESCRIPTION OF THE DRAWINGS

FIG. 1A and FIG. 1B are schematic views showing an example in which a wire harness according to a first embodiment is applied to a vehicle, in which FIG. 1A is a schematic view of the vehicle of the present example when viewed from a side, and FIG. 1B is a schematic view of the vehicle of the present example when viewed from above.

FIG. 2 is an enlarged view of the wire harness shown in FIG. 1B.

FIG. 4A and FIG. 4B are illustrative views of the shield pipe, in which FIG. 4A is a cross-sectional view when a second part 12a shown in FIG. 2 is cut along a cross section parallel to an axis (the second part 12a indicates a bellows-shaped portion of an intermediate portion, and a radius of curvature of the second part 12a is larger than that of a second part 12c in FIG. 6), and FIG. 4B is a view for explaining a position of the second part 12a.

FIG. 5A and FIG. 5B are illustrative views of the shield pipe, in which FIG. 5A is a cross-sectional view when a first part 11a shown in FIG. 2 is cut along a cross section parallel to an axis (the first part 11a indicates a bellows-shaped portion of a pipe end portion, and a radius of curvature of the first part 11a is larger than that of a first part 11b in FIG. 7), and FIG. 5B is a view for explaining a position of the first part 11a.

FIG. 6A and FIG. 6B are illustrative views of the shield pipe, in which FIG. 6A is a cross-sectional view when the second part 12c shown in FIG. 2 is cut along a cross section parallel to an axis (the second part 12c indicates a bellows-shaped portion of an intermediate portion of the wire harness 100, and a radius of curvature of the second part 12c is larger than that of the second part 12a in FIGS. 4A and 4B), and FIG. 6B is a view for explaining a position of the second part 12c.

FIG. 7A and FIG. 7B are illustrative views of the shield pipe, in which FIG. 7A is a cross-sectional view when a first part 11b shown in FIG. 2 is cut along a cross section parallel to an axis (the first part 11b indicates a bellows-shaped portion of a pipe end portion, and a radius of curvature of the first part 11b is larger than that of the first part 11a in FIG. 5B), and FIG. 7B is a view for explaining a position of the first part 11b.

FIG. 8A to FIG. 8E are schematic views for explaining a process of machining the shield pipe into a shape along a routing form after the electric wires are inserted through the shield pipes respectively, in which FIG. 8A to FIG. 8E are views in which the process is performed in a chronological order.

FIG. 9A and FIG. 9B are schematic views for explaining a method for joining a shield pipe used for a wire harness according to a second embodiment, in which FIG. 9A is a schematic view showing the shield pipe in a separated state before joining, and FIG. 9B is a schematic view showing a single connected shield pipe after joining.

FIG. 10A to FIG. 10E are schematic views for explaining a process of inserting an electric wire into a shield pipe used for a wire harness according to a third embodiment and a joining process of the wire harness, in which FIG. 10A to FIG. 10E are views in which a same process is performed in a chronological order.

DETAILED DESCRIPTION OF THE EXEMPLARY EMBODIMENTS

Hereinafter, wire harnesses according to embodiments (a first embodiment to a fourth embodiment) of the present invention will be described with reference to the drawings.

First Embodiment

Figure 1A:
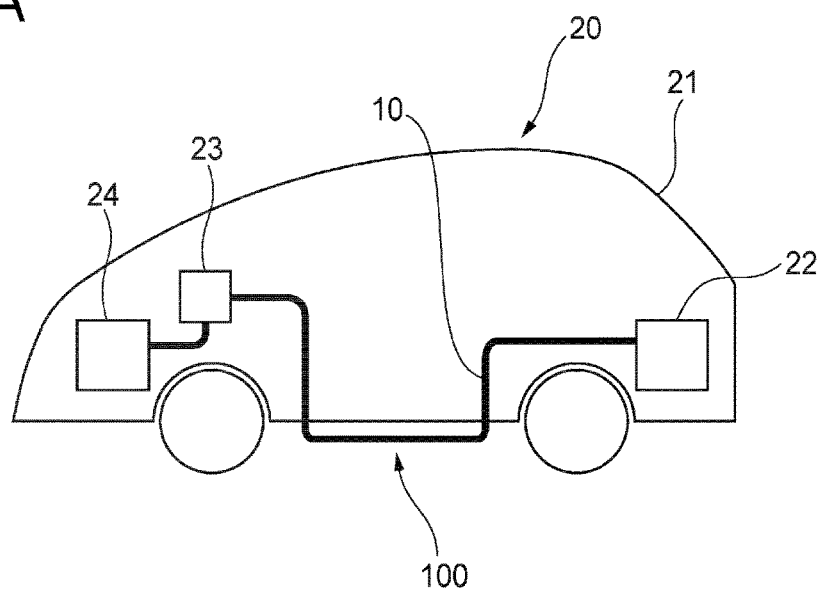
Figure 1B:
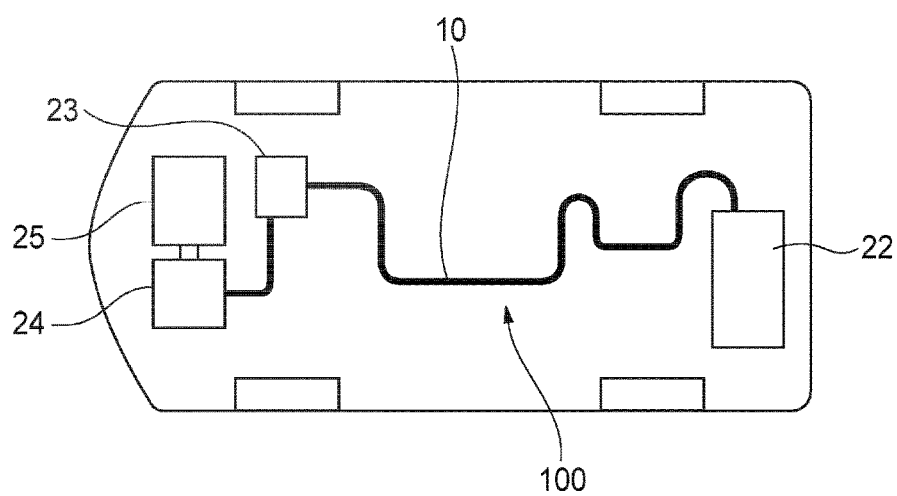

FIG. 1A and FIG. 1B show a state where a shield pipe 10 used for a wire harness (hereinafter, referred to as "wire harness 100") according to a first embodiment of the present invention is applied to a hybrid vehicle 20. Hereinafter, the hybrid vehicle 20 is simply referred to as "vehicle 20".

As shown in FIG. 1A and FIG. 1B, the vehicle 20 includes a battery 22 disposed at a rear side of a vehicle body 21, and a power control unit 23, a motor generator (MG) 24 and an internal combustion engine 25 which are disposed at a front side of the vehicle body 21.

The battery 22 and the power control unit 23 are connected to each other so that electric power can be transmitted and received by electric wires (electric wires 16 described later. See FIGS. 3A and 3B.) inserted inside the shield pipes 10. That is, the battery 22 and the power control unit 23 are connected by electric wires with shield pipes. The shield pipe 10 is routed such that an intermediate portion thereof passes under a floor of the vehicle body 21. Incidentally, the power control unit 23 and the motor generator (MG) 24 are connected by the electric wires with the shield pipes as described above.

Figure 3A:
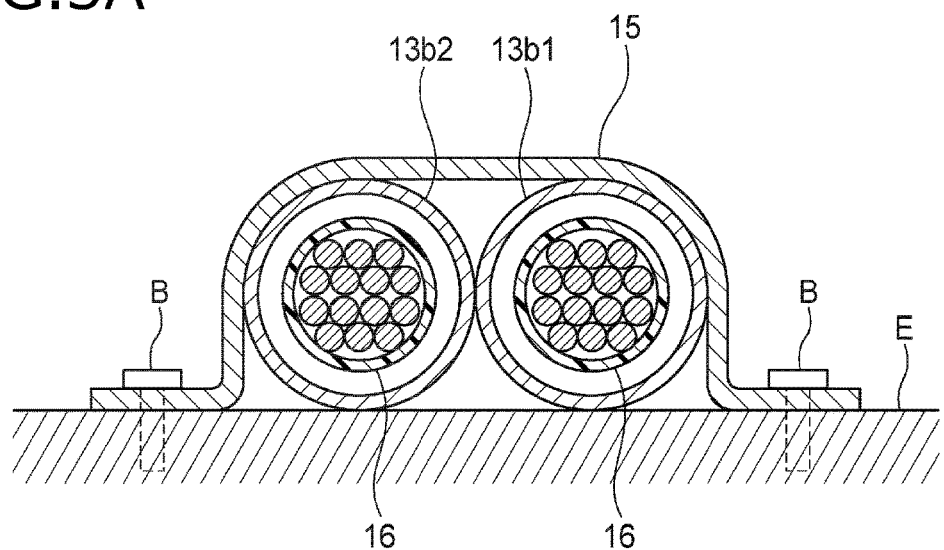
FIG. 3A is a cross-sectional view of the wire harness shown in FIG. 2 taken along a line A-A.
Figure 3B:
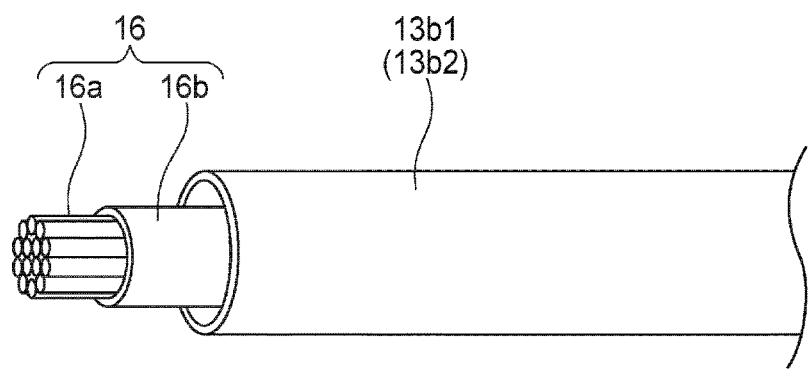
FIG. 3B is a schematic perspective view of electric wires and a shield pipe used for the wire harness shown in FIG. 2.

As shown in FIG. 2, FIG. 3A and FIG. 3B, the wire harness 100 has two metal shield pipes 10 each having a tube shape through which the electric wire 16 can be inserted. The electric wires 16 are inserted into (a hollow portion) the two shield pipes 10 respectively. That is, two shield pipes 10 are provided so as to correspond with the two electric wires 16 one-to-one. Incidentally, the wires 16 and the shield pipes 10 included in the wire harness 100 are not limited to two, and may be three or more according to a circuit configuration of the wire harness 100.

Specifically, each of the shield pipes 10 includes bellows-shaped first parts (11$a$1, 11$b$1, 11$a$2, 11$b$2) which are made of metal and provided at a pipe end portion of each of the shield pipes 10, bellows-shaped second parts (12$a$1, 12$b$1, 12$c$1, 12$d$1, 12$a$2, 12$b$2, 12$c$2, 12$d$2) which are made of metal and provided at an intermediate portion of each of the shield pipes 10 sandwiched by the first parts, and metal third parts (13$a$1, 13$b$1, 13$c$1, 13$d$1, 13$e$1, 13$a$2, 13$b$2, 13$c$2, 13$d$2, 13$e$2) which are portions of the intermediate portion except for the second parts 12$a$1 to 12$d$1, and 12$a$2 to 12$d$2.

The first parts 11$a$1 and 11$b$1 may be provided at a pipe end portion (that is, between an open end and a position apart from the open end by a predetermined length in consideration of the routing form of the electric wire 16, in a range necessary for the first parts 11$a$1, 11$b$1 to exhibit a required function) of one of the shield pipes 10, may be provided to include the open end, or may be provided to not include vicinity of the open end as necessary (for example, in a case where a portion or the like to be attached with connectors 14$a$, 14$b$ described later needs to be formed in the vicinity of the open end). The same applies to the first parts 11$a$2 and 11$b$2 on the other one of the shield pipes 10.

A metal material configuring the shield pipe 10 is not particularly limited, and a stainless material, aluminum, an aluminum alloy or the like can be used. In particular, compared to the aluminum and aluminum alloy, the stainless material has a higher electromagnetic shielding effect due to the high magnetic permeability, is lighter, and is excellent in resistance. Therefore, it is preferable to use the stainless material as the metal material configuring the shield pipe 10.

The one shield pipe 10 has a single pipe shape in which the first parts 11$a$1 and 11$b$1, the second parts 12$a$1 to 12$d$1, and the third parts 13$a$1 to 13$e$1 are seamlessly continuous. The shield pipe 10 with the above single pipe shape can be manufactured by a method in which a straight tubular metal pipe (a pipe without a bellows shape) is fixed into a mold having a shape corresponding to the first parts 11$a$1, 11$b$1, the second parts 12$a$1 to 12$d$1, and the third parts 13$a$1 to 13$e$1, and a hydraulic pressure is applied from the inside of the pipe (a hollow portion) to the mold so as to mold the bellows-shaped first parts to third parts (a so-called hydraulic pressure molding method), for example. The same applies to the first parts 11$a$2 and 11$b$2, the second parts 12$a$2 to 12$d$2, and the third parts 13$a$2 to 13$e$2 on the other shield pipe 10.

The connectors 14$a$ and 14$b$ accommodating end portions of the electric wires 16 or the like are attached at positions adjacent to end portions of the first parts 11$a$1, 11$b$1, 11$a$2, 11$b$2 or the first parts 11$a$1, 11$b$1, 11$a$2, 11$b$2. That is, in the one shield pipe 10, the first parts 11$a$1, 11$b$1 are provided at pipe end portions of the third parts 13$a$1, 13$e$1 and function as connecting portions connecting to the connectors 14$a$, 14$b$. The same applies to the first parts 11$a$2 and 11$b$2 on the other shield pipe 10.

The connector 14$a$ is fitted to a mating connector 23$a$ of the power control unit 23, and the connector 14$b$ is fitted to a mating connector 22$a$ of the battery 22. Further, the two shield pipes 10 are bound and fixed to the vehicle 20 by a conductive binding member 15 provided at a predetermined position. However, the binding member 15 is not always necessary, and the binding member 15 may be omitted depending on the routing form of the electric wire 16 or the like.

In a case where the binding member 15 is provided, the binding member 15 functions as an earth member for discharging electromagnetic noise blocked by the shield pipe 10 to the outside. Specifically, as long as the binding member 15 has a curved shape so as to abut against both the shield pipes 10 (third parts 13b1, 13b2) and an earthing object E (the vehicle body 21 or the like) as shown in FIG. 3A, the two shield pipes 10 can be bound and reliably grounded (earthed) by fastening the binding member 15 together with the two shield pipes 10 to the earthing object E with bolts B. Incidentally, since the entire shield pipe 10 is made of metal, the entire shield pipe 10 can be grounded not only at the position illustrated in FIG. 2, but also at any position thereof. In a case where the binding member 15 is not provided, a similar grounding effect can be obtained by connecting the shield pipe 10 to a negative electrode of the battery 22 at the periphery or the inside of the connectors 14a, 14b.

As shown in FIG. 3A, the electric wires 16 are inserted into (a hollow portion) the shield pipes 10 (third parts 13b1, 13b2) respectively. As shown in FIG. 3B, each of the electric wires 16 includes a plurality of conductors 16a and an insulator 16b covering the conductors 16a. In this manner, the two electric wires 16 are isolated to be not in contact with each other by being inserted into the shield pipes 10 respectively, so that the heat interference between the electric wires 16 can be suppressed as compared with the above-described related wire harness.

Figure 4A:
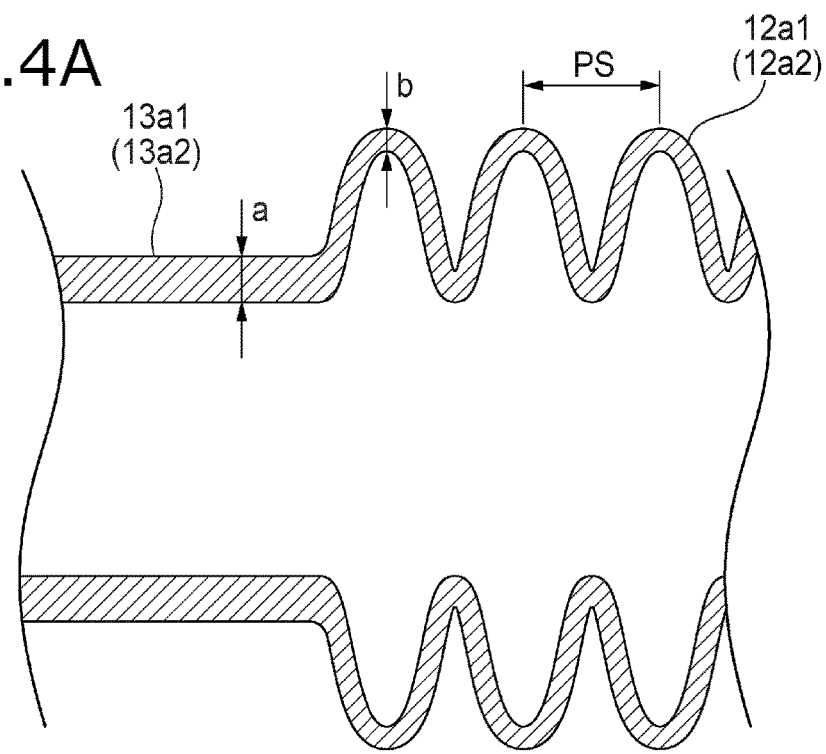
Figure 4B:
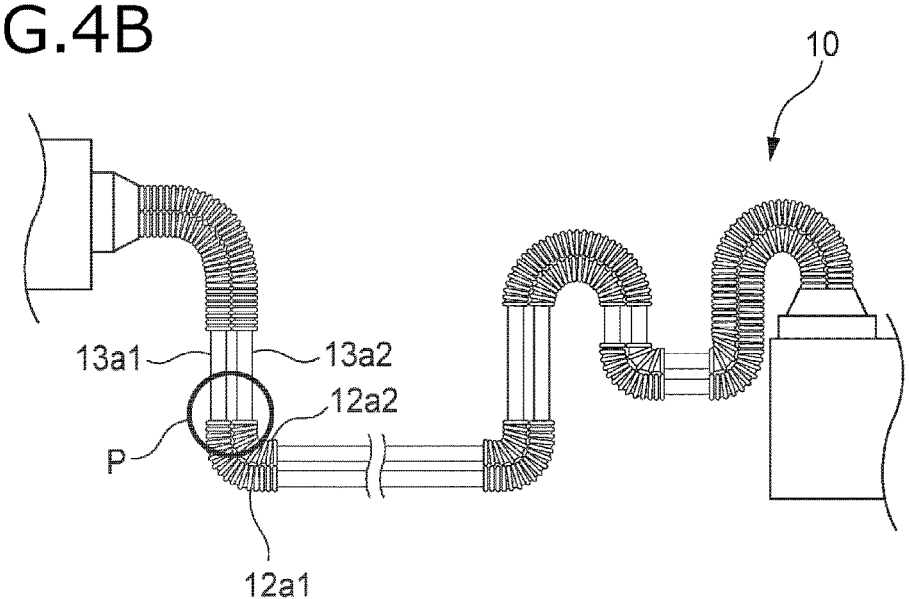
Figure 5A:
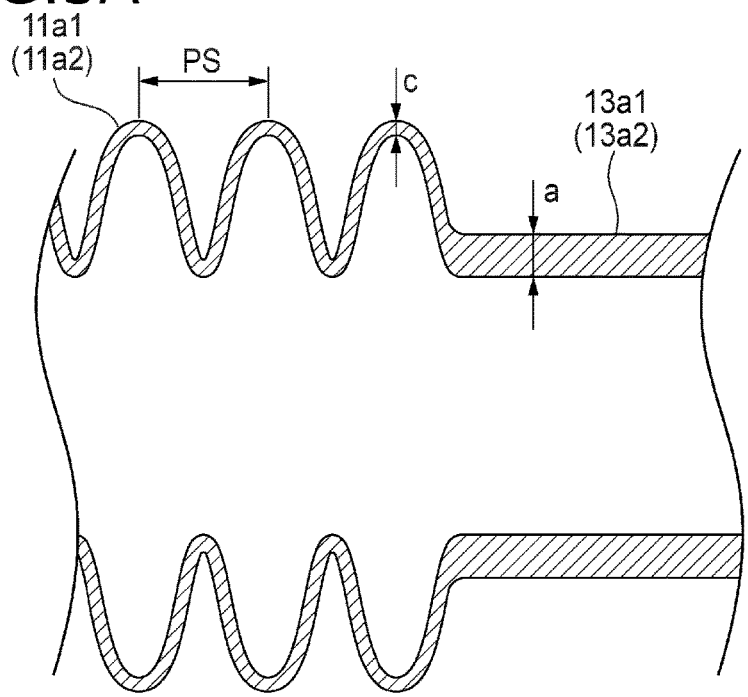
Figure 5B:
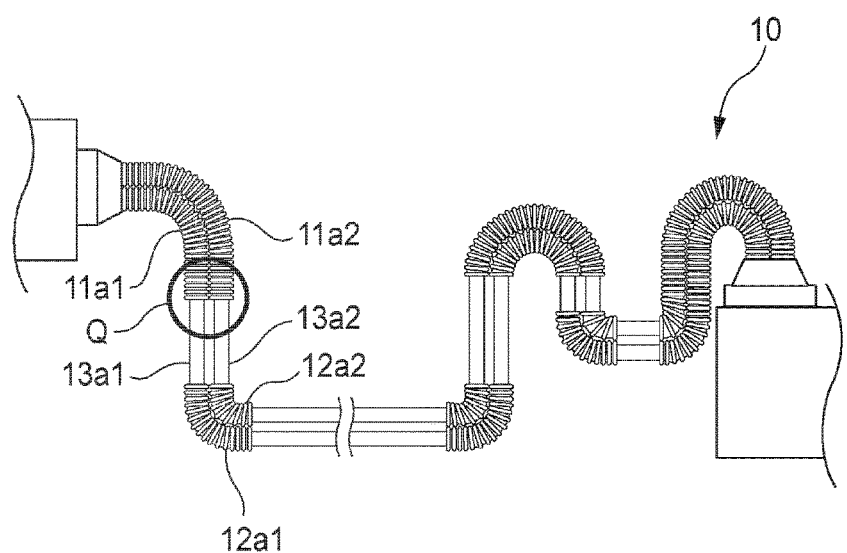

FIG. 4A is a cross-sectional view of the shield pipe 10 at a position P in FIG. 4B. As shown in FIG. 4A, the second part 12a1 of the one shield pipe 10 is formed to have a bellows shape with a wall thickness b smaller than a wall thickness a of the third part 13a1 (b<a). FIG. 5A is a cross-sectional view of the shield pipe 10 at a position Q in FIG. 5B. As shown in FIG. 4A, the first part 11a1 is formed to have a bellows shape with a wall thickness c which is smaller than the wall thickness a of the third part 13a1 and smaller than the wall thickness b of the second part 12a1 (c<b<a). The same applies to the first part 11a2, the second part 12a2 and the third part 13a2 on the other shield pipe 10.

The second parts 12a1 to 12d1 are configured to have a wall thickness which can self-hold a bent state after being bend by an external force (see FIG. 8A to 8E) even the external force is not applied any more (to have a plastic property). While the first parts 11a1 and 11b1 are configured to have a wall thickness which cannot self-hold a bent state after being bend by an external force when the external force is not applied any more (to have an elastic property). The wall thicknesses a, b, and c may be different according to metal materials configuring the shield pipe 10, but can be determined by performing experiments or the like in advance. The same applies to the first parts 11a2 and 11b2 and the second parts 12a2 to 12d2 on the other shield pipe 10.

Figure 6A:
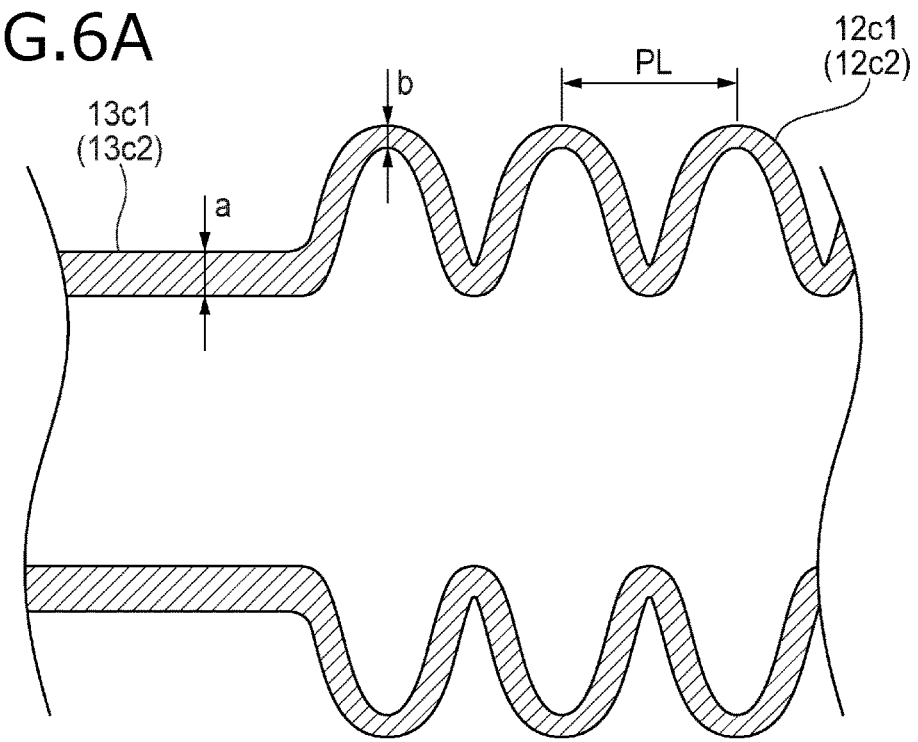
Figure 6B:
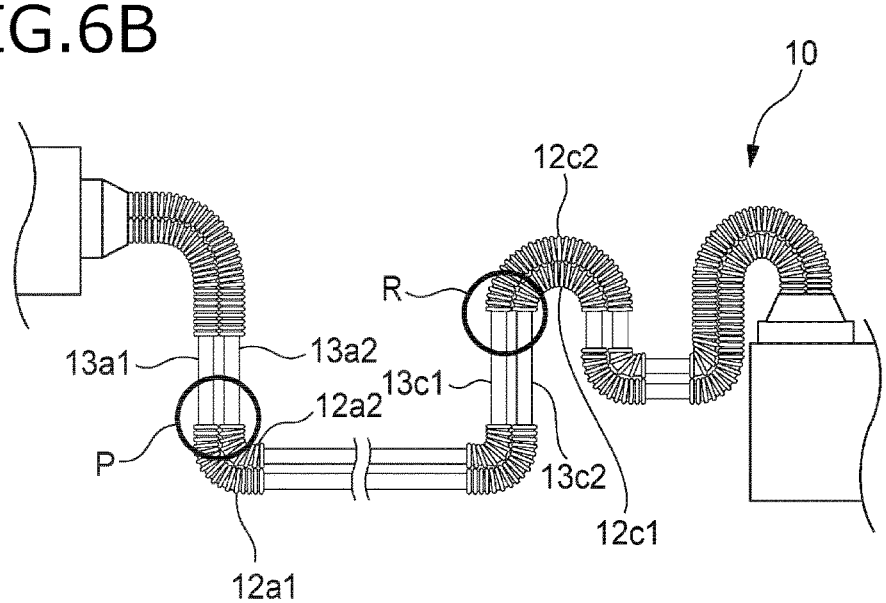
Figure 7A:
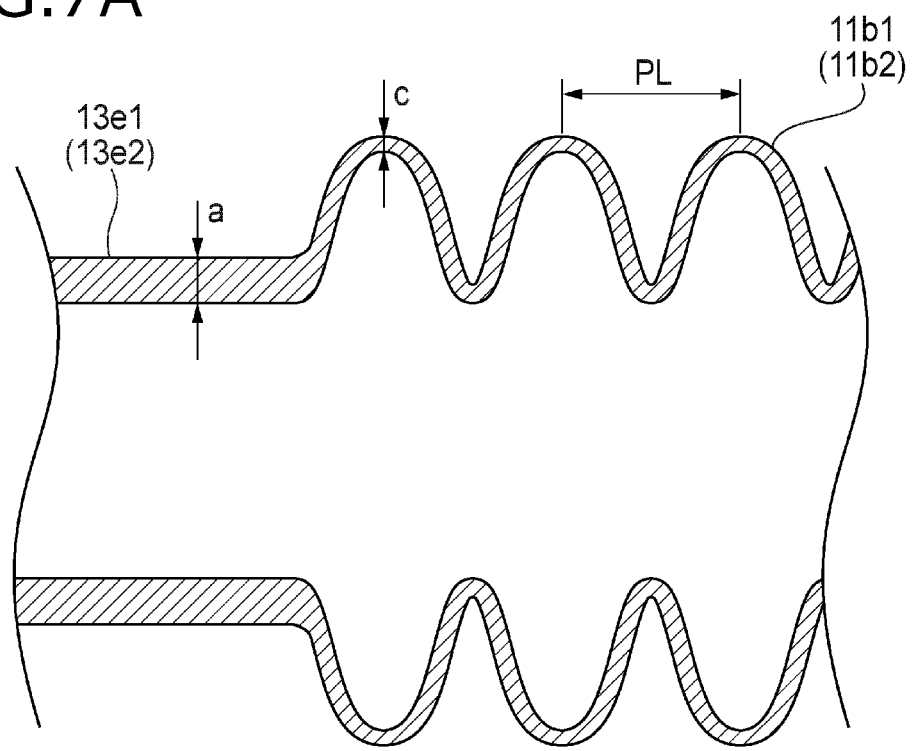
Figure 7B:
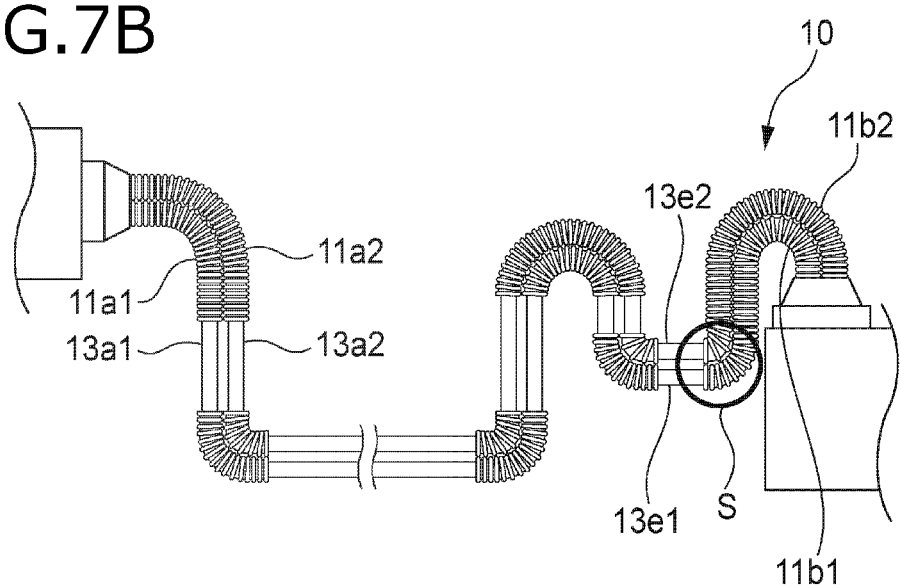

As shown in the cross-sectional view (a cross-sectional view of a position R in FIG. 6B) of FIG. 6A, the second part 12c1 whose radius of curvature is smaller than that of the second part 12a1 when being bent along the routing form of the electric wire 16 is formed into a bellows shape with a pitch length PL larger than a pitch length PS of a bellows shape of the second part 12a1. Similarly, as shown in the cross-sectional view (a cross-sectional view of a position S in FIG. 7B) of FIG. 7A, the first part 11b1 whose radius of curvature is smaller than that of the first part 11a1 when being bent along the routing form of the electric wire 16 is formed into a bellows shape with a pitch length PL larger than a pitch length PS of a bellows shape of the first part 11a1. The same applies to the first part 11b2 and the second part 12c2 on the other shield pipe 10.

Next, each process of machining the shield pipe 10 into a shape along the routing form after the electric wires 16 are inserted through each of the shield pipes 10 respectively—will be described.

Figure 8A:
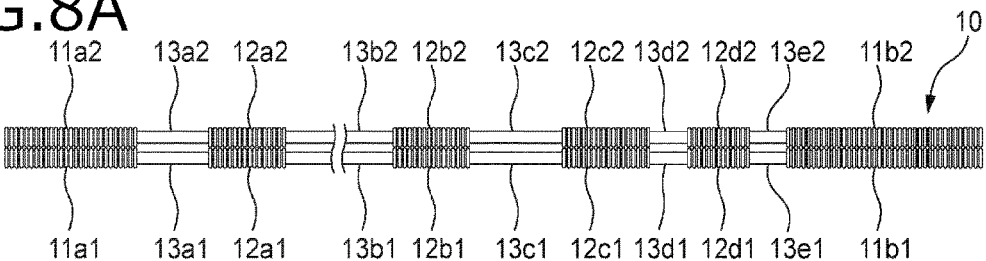

First, as shown in FIG. 8A, the one shield pipe 10 has a linear shape which is not bent before the electric wire 16 is inserted therethrough. At the time point shown in FIG. 8A, the first parts 11a1 and 11b1, the second parts 12a1 to 12d1, and the third parts 13a1 to 13e1 are disposed so as to correspond to a predetermined routing form (layout shown in FIG. 2) of the electric wires 16. The same applies to the other shield pipe 10.

Incidentally, the expression that the first parts 11a1 and 11b1, the second parts 12a1 to 12d1, and the third parts 13a1 to 13e1 are disposed to "correspond" to the routing form of the electric wires refers to that, for example, in one shield pipe (for example, the shield pipe in FIG. 2) machined (by bending or the like) to have a tubular shape matching with the routing form, the first parts 11a1 and 11b1, the second parts 12a1 to 12d1, and the third parts 13a1 to 13e1 are disposed at positions along (corresponding to) the routing form; or in one shield pipe (for example, the shield pipe in FIG. 8A) which is not machined as described above, the first parts 11a1 and 11b1, the second parts 12a1 to 12d1, and the third parts 13a1 to 13e1 are previously disposed at positions suitable for (corresponding to) the machining. That is, the shield pipe 10 may "correspond" to the routing form of the electric wires before machining, and may also "correspond" to the routing form of the electric wires after machining. The same applies to the other shield pipe 10.

Figure 8B:
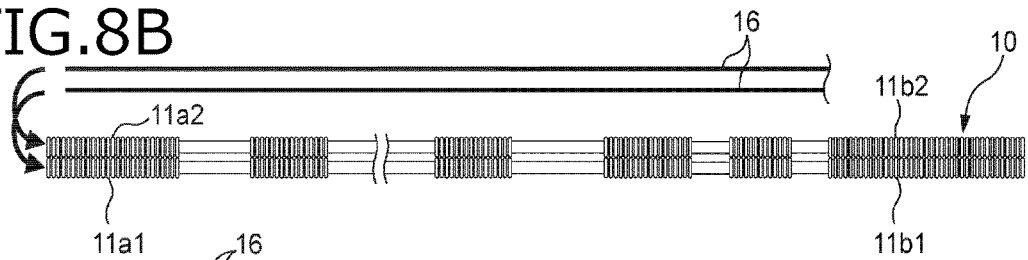

As shown in FIG. 8B, the electric wires 16 are inserted through the shield pipes 10 respectively from pipe end portions (pipe end portions of the first parts 11a1, 11a2) of the shield pipes 10.

Figure 8C:
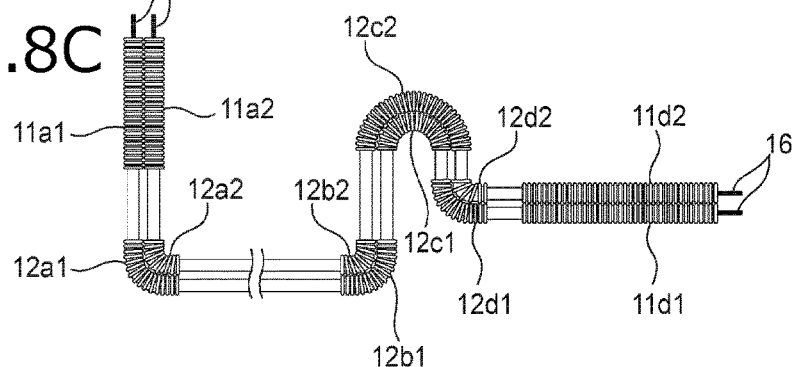

As shown in FIG. 8C, the second parts 12a1 to 12d1 and 12a2 to 12d2 are bent so as to correspond to the routing form of the electric wires 16. The second parts 12a1 to 12d1 and 12a2 to 12d2 are configured to have the wall thickness which can self-hold the bent state. At this point, the first parts 11a1, 11b1, 11a2, 11b2 are not bent.

Figure 8D:
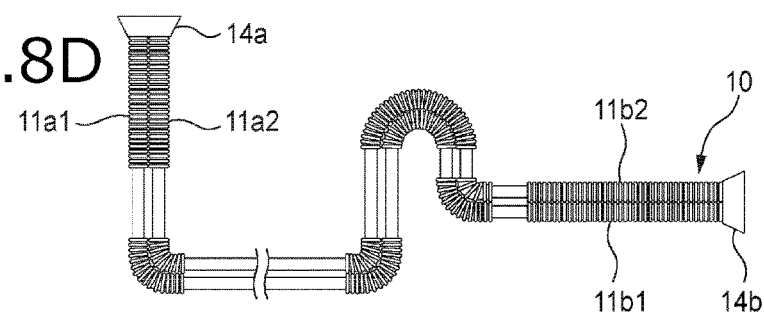

As shown in FIG. 8D, the connector 14a is attached to the end portions of the first parts 11a1, 11a2, and the connector 14b is attached to the end portions of the first parts 11b1, 11b2. Accordingly, the wire harness 100 is configured.

Figure 8E:
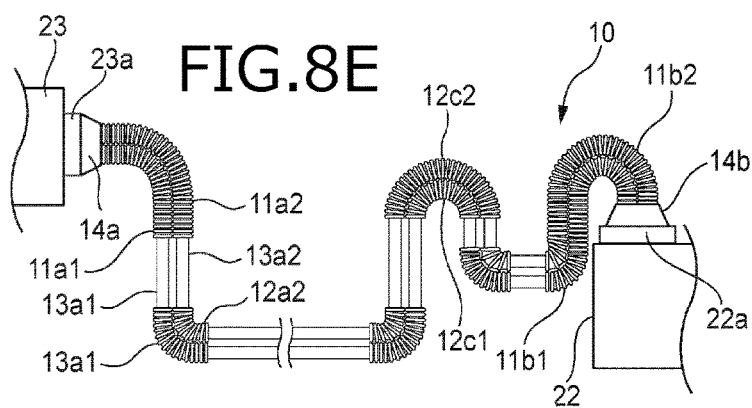

As shown in FIG. 8E, the first parts 11a1 and 11a2 are bent so that the connector 14a is fitted to the mating connector 23a of the power control unit 23, and the first parts 11b1 and 11b2 are bent so that the connector 14b is fitted to the mating connector 22a of the battery 22. As a result, the routing of the wire harness 100 is completed (a state which is the same as the state shown in FIG. 2).

As described above, according to the wire harness 100 of the first embodiment, the metal shield pipes 10 are provided to correspond to the plurality of electric wires 16 one-to-one. That is, the electric wires 16 are inserted through each of the plurality of shield pipes 10 respectively. Therefore, in the wire harness 100, the plurality of electric wires 16 are not disposed close to each other in the shield pipe 10, and heat interference between the electric wires 16 can be suppressed.

Further, according to the wire harness 100, a shielding function can be appropriately imparted to the electric wires 16 since the entire electric wire 16 is covered by the shield pipe 10 and the first parts 11a1, 11b1, 11a2 and 11b2 which are the metal connecting portions. In addition, the shield pipe 10 has a rigidity that can self-hold a shape after bending, so that a number of fixing tools (a clamp or the like) can be reduced when the shield pipe is assembled to the vehicle 20, for example. The first parts 11a1, 11b1, 11a2 and 11b2 have a flexibility that cannot self-hold a shape after bending, so that the first parts 11a1, 11b1, 11a2 and 11b2 can be flexibly deformed and the wire harness can be machined along the routing form.

Therefore, in the wire harness 100, a shielding function can be imparted to the plurality of electric wires 16 and heat interference between the electric wires 16 can be suppressed. Further, due to the flexibility of the first parts 11b1, 11a2 and 11b2 which are the connecting portions, dimensional errors (manufacturing variations) inevitable in the pipe can be absorbed, and vibrations or the like that may occur when the wire harness 100 is actually mounted on a vehicle or the like can also be absorbed.

The one shield pipe 10 is implemented as a shield pipe which can be easily bent as described above by setting the wall thickness c of the first parts 11a1 and 11b1 smaller than the wall thickness b of the second parts 12a1 to 12d1 (c<b). The same applies to the other shield pipe 10.

The shield pipe 10 further includes tubular metal second parts 12a1 to 12d1, and 12a2 to 12d2 formed into a bellows shape which can be bent by an external force smaller than one sufficient to bend the third parts 13a1 to 13e1, and 13a2 to 13e2. Therefore, the work of bending the wire harness 100 along a predetermined routing form (layout) can be facilitated. Specifically, the second parts 12a1 to 12d1, and 12a2 to 12d2 are bent without using a dedicated machining equipment (for example, by manual work by an operator), and the wire harness 100 can be machined into a shape along the routing form.

According to the wire harness 100, the plurality of shield pipes 10 are bound by the conductive binding member 15 and fixed to the earthing object E (for example, a vehicle body frame of the vehicle 20). Accordingly, the electromagnetic noise blocked by the conductive shield pipe 10 can be discharged to the earthing object E via the binding member 15 after passing through the shield pipe 10 itself. Therefore, for example, it is not necessary to provide a dedicated mechanism (earth mechanism) for discharging the electromagnetic noise to the connectors 14a, 14b or the like, a number of components can be reduced, and the manufacturing of the wire harness 100 can be facilitated and the cost can be reduced.

In addition, since the shield pipe 10 has a single continuous tube shape without a seam, the number of components can be reduced. Therefore, the manufacture of the wire harness 100 is facilitated.

The above is the description of the wire harness 100 according to the first embodiment.

Second Embodiment

Next, a wire harness 100A according to a second embodiment of the present invention will be described with reference to FIG. 9A and FIG. 9B. This wire harness 100A is different from the wire harness 100 of the first embodiment in that a first part 11a1 and a second part 12a1 of one of shield pipes 10 are different members which are separated from each other. Incidentally, although the illustration is omitted, the same configuration can be adopted for the other one of the shield pipes 10.

Figure 9A:
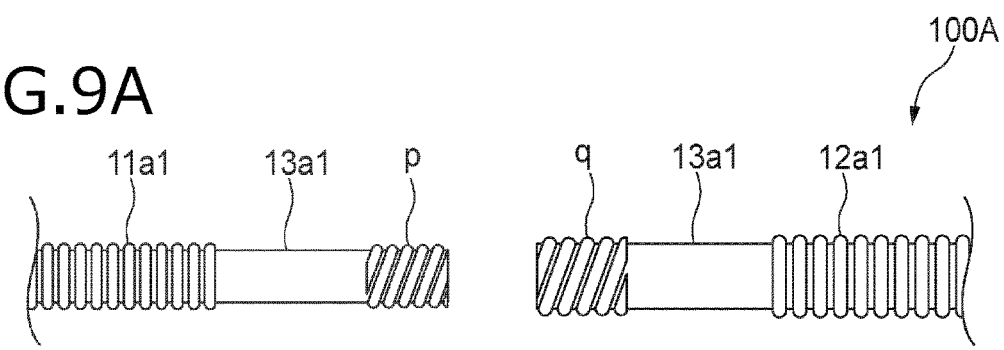
Figure 9B:
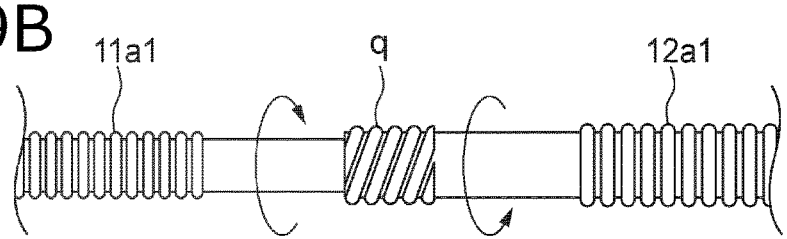

As shown in FIG. 9A, in the shield pipe 10, an intermediate portion of a third part 13a1 between the first part 11a1 and the second part 12a1 is separated. That is, the first part 11a1 and the second part 12a1 are different members which are separated from each other.

The third part 13a1 includes a male thread p and a female thread q so that both end portions of the separated parts can be screwed and jointed. As shown in FIG. 9B, the third part 13a1 is joined by screwing the male thread p into the female thread q. Incidentally, a joint portion may be optionally covered with a cover which prevents intrusion of water from the outside.

In the wire harness 100A according to the second embodiment, the first part 11a1 and the second part 12a1 prepared as different members which are separated from each other are joined via the third part 13a1. Although a manufacturing process of the shield pipe 10 becomes complicated in some degree, a length of the first part 11a is shorter than that of the shield pipe 10 of the first embodiment, so that a process (see FIG. 9A and FIG. 9B) of inserting an electric wire through the shield pipe 10 becomes easier. Further, since the first part 11a1 is formed of a metal material suitable for a bending mode or the like thereof, the manufacturing and use of the wire harness 100A can be made easier.

Third Embodiment

Next, a wire harness 100B according to a third embodiment of the present invention will be described with reference to FIG. 10A to FIG. 10E. The wire harness 100B is different from the wire harness 100 of the first embodiment in that a tubular third part 13a1 is formed by winding and welding a metal flat plate, and a first part 11a1 and a second part 12a1 are welded to both ends of the third part 13a1. Incidentally, although the illustration is omitted, the same configuration can be adopted for the other one of the shield pipes 10.

Figure 10A:
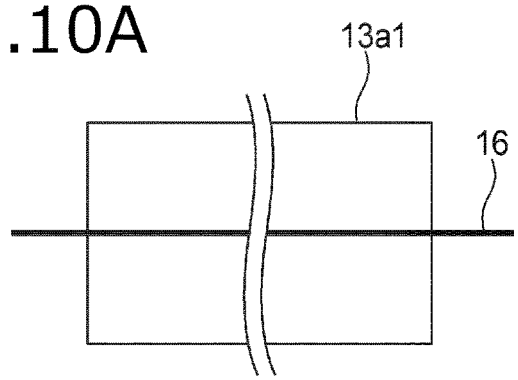
Figure 10B:
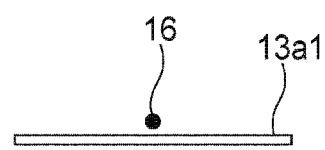
Figure 10C:
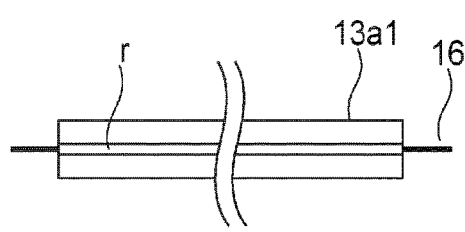
Figure 10D:
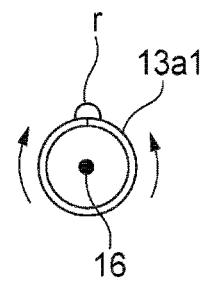
Figure 10E:
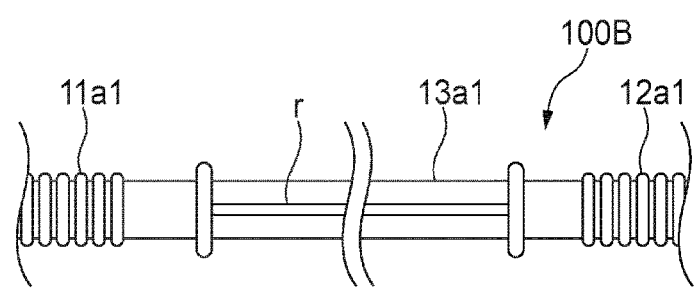

As shown in FIG. 10A, the third part 13a1 has a flat plate shape before being machined. Therefore, an electric wire 16 is first disposed on the flat plate-shaped third part 13a1. FIG. 10B is a side view of the third part 13a1 and the electric wire 16 when being disposed as described above. Next, as shown in FIG. 10C, the third part 13a1 is wound with the electric wire 16 therein, and then end surfaces of the third part 13a1 are welded to each other. In the figures, r represents a welding trace. FIG. 10D is a side view of the third part 13a1 and the electric wire 16 when being disposed as described above. As shown in FIG. 10E, the first part 11a1 and the second part 12a1 are welded to both ends of the third part 13a1. Therefore, the third part 13a1 is joined to the first part 11a1 and the second part 12a1.

In the wire harness 100B according to the third embodiment, the tubular third part 13a1 is formed by winding and welding a metal flat plate, and the first part 11a1 and the second part 12a1 are welded to both ends of the third part 13a1. As in the second embodiment, although a manufacturing process of the shield pipe becomes complicated in some degree, a process of inserting an electric wire through the shield pipe 10 becomes easier. Further, since the third part 13a1 is formed of a metal material suitable for the bending mode, the manufacturing and use of the wire harness 100B can be made easier.

Fourth Embodiment

Next, a wire harness 100C according to a fourth embodiment of the present invention will be described with reference to FIG. 11. The wire harness 100C is different from the wire harness 100 of the first embodiment in that the bellows-shaped first parts 11a1, 11a2 provided at the pipe end portion of the one shield pipe 10 (on the power control unit 23 side) are replaced by braided conductors 17a1, 17a2. Although not shown, the bellows-shaped first parts 11b1 and 11b2 provided at the pipe end portion of the other shield pipe 10 (on the battery 22 side) may also be replaced by braided conductors.

Figure 11:
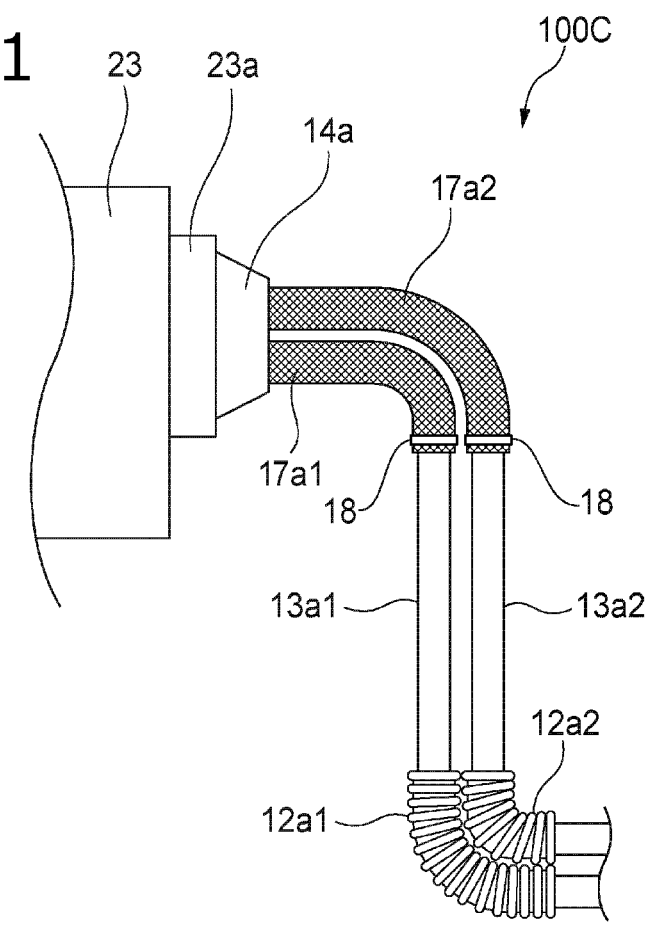
FIG. 11 is a schematic diagram showing a wire harness according to a fourth embodiment.

As shown in FIG. 11, the tubular braided conductors 17a1, 17a2 are attached to end portions of third parts 13a1, 13a2. The braided conductors 17a1, 17a2 are tubular bodies configured by meshed woven metal thin wires, and function as a shield layer configured to shield electromagnetic noise or the like. The braided conductors 17a1, 17a2 are attached to the third parts 13a1, 13a2 by tightening the tubular braided conductors 17a1, 17a2 on the third parts 13a1, 13a2 by using a tie wrap 18, for example. The braided conductors 17a1, 17a2 also function as connecting portions which are configured to connect the third parts 13a1 and 13a2 with the connectors 14a and 14b.

Further, a protective member (a corrugated pipe or the like) for protecting the braided conductors 17a1, 17a2 and a waterproof member (a grommet or the like) for preventing intrusion of liquid may be optionally added.

In the wire harness 100C according to the fourth embodiment, braided conductors 17a1, 17a2 are used instead of the bellows-shaped first parts 11a1, 11a2. The braided conductors 17a1, 17a2 can be easily prepared and obtained at low cost since it is not necessary to machine a tubular metal material into a bellows shape like the first parts 11a1, 11a2. Further, a weight of the wire harness 100C can be reduced since the braided conductors 17a1, 17a2 are generally lighter than a tubular metal material.

Other Embodiment

The present invention is not limited to the above-described embodiments, and various modifications can be adopted within the scope of the present invention. For example, the present invention is not limited to the above-described embodiments, but may be appropriately modified, improved or the like. Besides, materials, shapes, dimensions, numbers, arrangement places or the like of the constituent elements in the above-described embodiments are arbitrary and not limited as long as the present invention can be achieved.

For example, the shield pipes 10 used for the wire harnesses 100, and 100A to 100C have bellows-shaped second parts 12a1 to 12d1 and 12a2 to 12d2, and tubular third parts 13a1 to 13e1 and 13a2 to 13e2 located at positions between the first parts 11a1, 11a2, 11b1 and 11b2 which are provided at both end portions of the shield pipes 10. However, the shield pipe 10 may include the tubular third parts only over the entire portion between the first parts, and not include the second parts.

Figure 12:
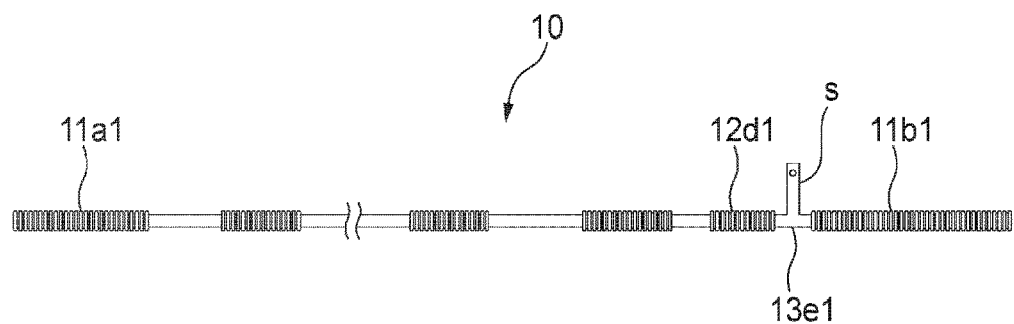
FIG. 12 is a schematic diagram showing a wire harness according to another embodiment.

As shown in FIG. 12, the shield pipes 10 used for the wire harnesses 100, and 100A to 100C may be configured such that an earth member s for grounding is extended from a part (13e1 in FIG. 12) of the third parts.

Figure 13:
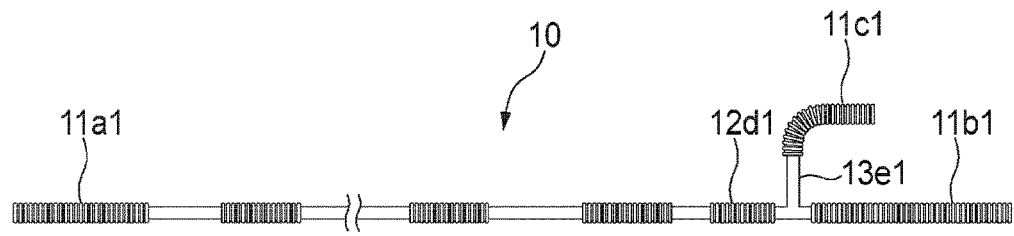
FIG. 13 is a schematic diagram showing a wire harness according to another embodiment.

As shown in FIG. 13, the shield pipes 10 used for the wire harnesses 100, and 100A to 100C may be configured such that a part (13e1 in FIG. 13) of the third parts is branched. In this example, a first part 11c1 is further provided at an end portion of a branch path of the third part 13e1.

Figure 14:
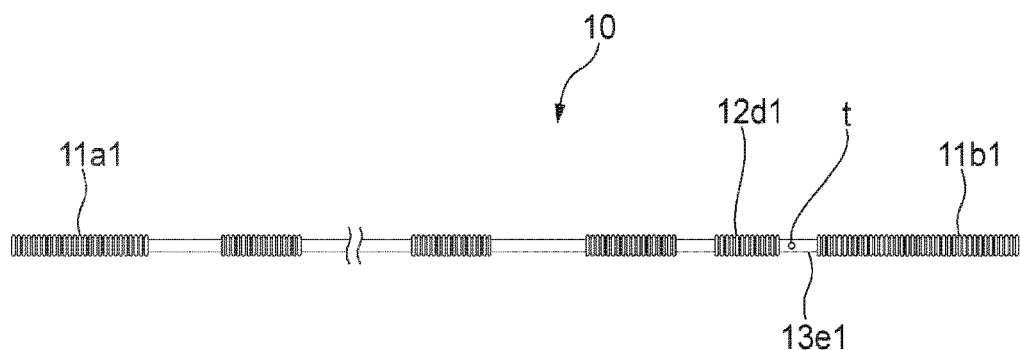
FIG. 14 is a schematic diagram showing a wire harness according to another embodiment.

As shown in FIG. 14, the shield pipes 10 used for the wire harnesses 100, and 100A to 100C may be configured to have an opening t for draining on a part (13e1 in FIG. 13) of the third parts. Incidentally, the opening t may be optionally covered with a cover which prevents intrusion of water from the outside.

In the vehicle 20 to which the wire harnesses 100 to 100 C are applied, the battery 22 is mounted on a rear side of the vehicle 20. However, in the vehicle 20, the battery 22 may be mounted under a floor of the vehicle body 21, or the battery 22 may be mounted in an engine room. Further, regardless of the location of the battery 22, the wire harness of the present invention may be used as a shielding member of an electric wire connecting the battery 22 and the power control unit 23.

In the first to fourth embodiments, as an exemplified method of forming a portion (the first part and the second part) with a bellows shape, a hydraulic pressure molding method is exemplified. However, in the present invention, a method of connecting an inner edge and an outer edge of a disk-shaped thin metal plate while alternately welding them (a so-called welded bellows molding method) can be used as the method of forming the portion (the first part and the second part) with a bellows shape. The method can be used, for example, when forming a shield pipe by a plurality of separated members as in the second embodiment and the third embodiment.

The wire harnesses 100 to 100C according to the first to fourth embodiments are applied to the hybrid vehicle 20. However, the wire harnesses 100 to 100C of the present invention may be applied to an electric automobile, and may also be applied to an ordinary automobile (with only an internal combustion engine as a driving source) in some cases.

Further, aspects of the embodiments of the wire harnesses according to the invention described above are summarized briefly in the following (1) to (4), respectively.

(1) A wire harness (100 to 100C), includes: a plurality of electric wires (16); a plurality of tubular metal pipes (10) corresponding to the plurality of electric wires one-to-one and having each of the plurality of electric wires inserted therein; connectors (14a, 14b) to which end portions of the plurality of electric wires are connected; and tubular metal connecting portions (11a1, 11b1, 11a2, 11b2, 17a1, 17a2) provided at a pipe end portion of each of the plurality of pipes and connected to the connectors, in which each of the pipes has a rigidity capable of self-holding a shape after bending, and the connecting portion has a flexibility incapable of self-holding a shape after bending.

(2) In the wire harness according to (1), the connecting portions are bellows-shaped first parts (11a1, 11b1, 11a2, 11b2) or braided conductors (17a1, 17a2) which are made of metal and can be bent by an external force smaller than one sufficient to bend the pipe (10).

(3) In the wire harness according to (1) or (2), an intermediate portion of the pipe includes tubular metal second parts (12a1 to 12d1, 12a2 to 12d2) formed into a bellows shape which can be bent by an external force smaller than one sufficient to bend the pipe and can self-hold a shape after bending.

(4) The wire harness according to any one of the (1) to (3) further includes a conductive binding member (15) which is configured to bind the plurality of pipes and fix the plurality of pipes to an attachment object.

What is claimed is:
1. A wire harness comprising:
a plurality of electric wires each including a plurality of conductors and an insulator covering the conductors;
a plurality of tubular metal pipes corresponding to the number to the plurality of electric wires in a one-to-one ratio, each of the plurality of electric wires being inserted through respective one of the plurality of tubular metal pipes and isolated to be not in contact with each other so that heat interference between the electric wires is suppressed;

a connector configured to be connected to end portions of the plurality of electric wires; and a tubular metal connecting portion provided at a pipe end portion of each of the plurality of pipes and connected to the connector, wherein each of the pipes has a rigidity capable of self-holding a bent shape thereof when each of the pipes are bent, and wherein the connecting portion has a flexibility incapable of self-holding a bent shape thereof when the connecting portion is bent.

2. The wire harness according to claim 1, wherein the connecting portion is a bellows-shaped first part or a braided conductor which is made of metal and configured to be bendable by an external force smaller than one capable of bending the pipe.

3. The wire harness according to claim 2, wherein the first part is a seamlessly continuous portion from the pipe without joint parts therebetween.

4. The wire harness according to claim 1, wherein an intermediate portion of the pipe includes a tubular metal second part formed into a bellows shape which is configured to be bendable by an external force smaller than one capable of bending the pipe and self-hold a bent shape of the pipe when the pipe is bent.

5. The wire harness according to claim 1, further comprising:

a conductive binding member configured to bind the plurality of pipes and fix the plurality of pipes to an attachment object.

6. The wire harness according to claim 5, wherein the binding member has a shape complementary to the plurality of pipes so as to abut against the plurality of pipes.

7. The wire harness according to claim 1, wherein the pipes and the connecting portions corresponding to each of the plurality of electric wires are aligned in a same configuration.

8. The wire harness according to claim 1, wherein the connecting portion has a bellows-shaped first part which is made of metal;

wherein the pipe has a bellows-shaped second part which is made of metal and a straight pipe-shaped third part which is made of metal; and wherein a wall thickness of the first part is smaller than a wall thickness of the third part and is smaller than a wall thickness of the second part.

* * * * *